US006876962B2

(12) United States Patent
Reblewski (10) Patent No.: US 6,876,962 B2
(45) Date of Patent: *Apr. 5, 2005

(54) METHOD AND APPARATUS FOR CONCURRENT EMULATION OF MULTIPLE CIRCUIT DESIGNS ON AN EMULATION SYSTEM

(75) Inventor: Frederic Reblewski, Paris (FR)

(73) Assignee: Mentor Graphics Corporation, Wilsonville, OR (US)

( * ) Notice: Subject to any disclaimer, the term of this patent is extended or adjusted under 35 U.S.C. 154(b) by 168 days.

This patent is subject to a terminal disclaimer.

(21) Appl. No.: 10/273,700

(22) Filed: Oct. 18, 2002

(65) Prior Publication Data

US 2003/0055622 A1 Mar. 20, 2003

Related U.S. Application Data

(63) Continuation of application No. 09/405,659, filed on Sep. 24, 1999, now Pat. No. 6,473,726.

(51) Int. Cl.[7] .............................................. G06F 9/455
(52) U.S. Cl. .............................. 703/26; 703/14; 716/16; 716/17
(58) Field of Search ............................... 703/28, 14, 16, 703/23, 26; 716/16, 17; 702/118; 714/725

(56) References Cited

U.S. PATENT DOCUMENTS

| 5,036,473 | A | | 7/1991 | Butts et al. .................... 703/23 |
| 5,109,353 | A | | 4/1992 | Sample et al. ................. 716/17 |
| 5,960,191 | A | * | 9/1999 | Sample et al. ................. 703/28 |
| 6,265,894 | B1 | | 7/2001 | Reblewski et al. ............ 326/39 |
| 6,377,912 | B1 | * | 4/2002 | Sample et al. ................. 703/28 |
| 6,473,726 | B1 | * | 10/2002 | Reblewski .................... 703/26 |

FOREIGN PATENT DOCUMENTS

EP     0 651 343 A1    5/1995

WO     WO 94/06210     3/1994

OTHER PUBLICATIONS

Bosi et al., Reconfigurable Pipelined 2–D Convolvers for Fast Digital Signal Processing, IEEE Transactions on Very Large Scale Integration (VLSI) Systems, vol. 7, Issue 3, Sept. 1999, pp. 299–308.

Ejnioui et al., Design Partitioning on Single–Chip Emulation Systems, 13th International Conference on VLSI Design, 2000, pp. 234–239.

Erhard et al., First Steps Towards a Reconfigurable Asynchronous System, IEEE International Workshop on Rapid System Prototyping, 1999, pp. 28–31.

Jean et al., Dynamic Reconfiguration of Support Concurrent Applications, IEEE Symposium of FPGAs for Custom Computing Machines, 1998, pp. 302–303.

Jean et al., Dynamic Reconfiguration to Support Concurrent Applications, IEEE Transactions on Computers, Jun. 1999, IEEE, USA, vol. 48, No. 6, pp. 591–602.

Kocan et al., Concurrent D–Algorithm on Recconfigurable Hardware, IEEE/ACM International Conference on Computer—Aided Design, 1999, digest of Technical Papers, pp. 152–155.

Teramac Compiler, Nov. 29, 1993.

Xilinx, "The Programmable Gate Array Design Handbook" (1986).

* cited by examiner

*Primary Examiner*—Russell Frejd
(74) *Attorney, Agent, or Firm*—Banner & Witcoff, Ltd.

(57) ABSTRACT

An emulation system equipped to emulate multiple circuit designs concurrently is disclosed. The emulation system includes an emulator having reconfigurable emulation resources for emulating circuit designs, and a host system programmed with programming instructions that operate to generate coordinated configuration information for a number of circuit designs to enable the reconfigurable emulation resources to be configured in a coordinated manner to allow the circuit designs to be emulated concurrently.

8 Claims, 11 Drawing Sheets

METHOD AND APPARATUS FOR CONCURRENT EMULATION OF MULTIPLE CIRCUIT DESIGNS ON AN EMULATION SYSTEM

RELATED APPLICATIONS

This application is a continuation of application Ser. No. 09/405,659 entitled "Method and Apparatus for Concurrent Emulation of Multiple Circuit Designs on an Emulation System" filed on Sep. 24, 1999 now U.S. Pat. No. 6,473,726.

BACKGROUND OF THE INVENTION

1. Field of the Invention

The present invention pertains to the field of circuit design emulation. More particularly, this invention relates to the subject of emulation system utilization efficiency.

2. Background

With advances in integrated circuit technology, various tools have been developed to aid circuit designers in designing and debugging highly complex integrated circuits. In particular, emulation systems comprising reconfigurable emulation resources such as reconfigurable logic chips, reconfigurable interconnects, and so forth, have been developed for circuit designers to quickly "realize" their designs and emulate operation of the circuits.

Emulation systems known in the art all suffer from at least one common disadvantage in that they are merely equipped to allow one circuit design to be emulated at a time. Since not all circuit designs will require all emulation resources of an entire emulation system to emulate, prior art emulation systems are inefficient in facilitating utilization of the available emulation resources. The inefficiency has increased over the years as more and more emulation resources are packed into the newer emulation systems to accommodate emulation of the ever more complex integrated circuits being designed. Unfortunately, there is no abatement in sight to this undesirable inefficiency trend. Thus, a more efficient approach to utilizing emulation resources of an emulation system is desired.

SUMMARY OF THE INVENTION

An emulation system equipped to emulate multiple circuit design concurrently is disclosed. The emulation system includes an emulator having reconfigurable emulation resources for emulating circuit designs, and a host system programmed with programming instructions that operate to generate coordinated configuration information for a number of circuit designs to enable the reconfigurable emulation resources to be configured in a coordinated manner to allow the circuit designs to be emulated concurrently.

BRIEF DESCRIPTION OF THE DRAWINGS

The present invention is illustrated by way of example and not limitation in the figures of the accompanying drawings, in which like references indicate similar elements and in which.

DETAILED DESCRIPTION

In the following description, various aspects of the present invention will be described. However, it will be apparent to those skilled in the art that the present invention may be practiced with only some or all aspects of the present invention. For purposes of explanation, specific numbers, materials and configurations are set forth in order to provide a thorough understanding of the present invention. However, it will also be apparent to one skilled in the art that the present invention may be practiced without the specific details. In other instances, well known features are omitted or simplified in order not to obscure the present invention.

Part of the description will be presented in terms of operations performed by a computer system, using terms such as data, flags, bits, values, characters, strings, numbers and the like, consistent with the manner commonly employed by those skilled in the art to convey the substance of their work to others skilled in the art. As well understood by those skilled in the art, these quantities take the form of electrical, magnetic, or optical signals capable of being stored, transferred, combined, and otherwise manipulated through mechanical and electrical components of the computer system; and the term computer system includes general purpose as well as special purpose data processing machines, systems, and the like, that are standalone, adjunct or embedded.

Various operations will be described as multiple discrete steps in turn, in a manner that is most helpful in understanding the present invention, however, the order of description should not be construed as to imply that these operations are necessarily order dependent. In particular, these operations need not be performed in the order of presentation.

Figure 1:
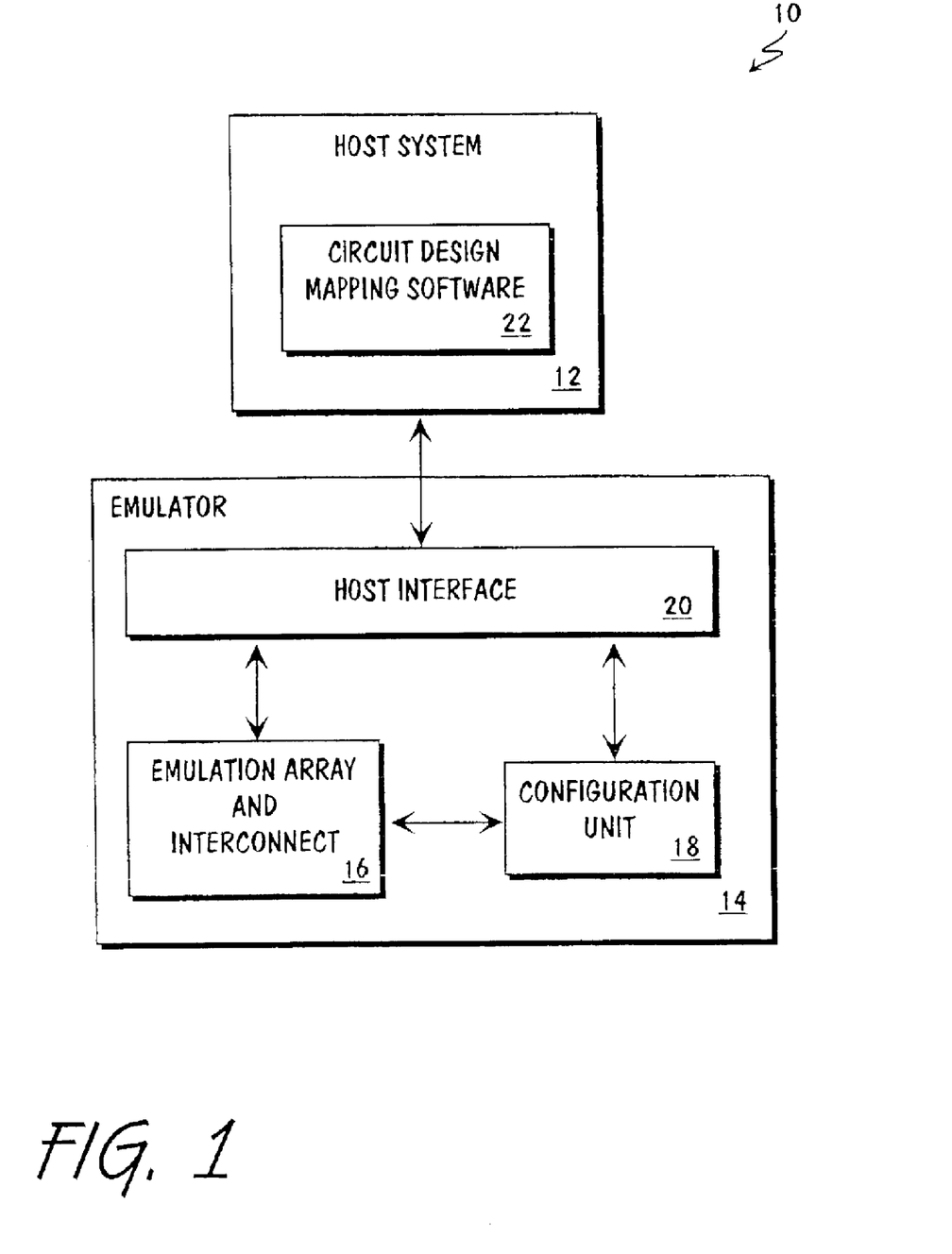
FIG. 1 is a block diagram showing an exemplary emulation system incorporated with the teachings of the present invention.

Referring now to FIG. 1, wherein a block diagram illustrating an exemplary emulation system incorporated with the teachings of the present invention is shown. As illustrated, emulation system 10 includes host system 12 and emulator 14. Host system 12 includes in particular circuit design mapping software 22 incorporated with teachings of the present invention, whereas emulator 14 includes configuration unit 18, host interface 20, and emulation resources denoted as emulation array and interconnect 16, coupled to each other as shown. In accordance with the present invention, circuit design mapping software 22 advantageously generates coordinated configuration information for multiple circuit designs to configure emulation resources 16 of emulator 14 in a coordinated manner to allow multiple circuit designs to be emulated concurrently, thereby improving utilization efficiency of emulation system 10 over prior art emulation systems.

Various embodiments of circuit design mapping software 22 will be described in detail below with references to FIG. 3–11. Except for circuit design mapping software 22, host system 12 is intended to represent a broad category of host systems found in conventional emulation systems. Thus, except for mapping software 22, host system 12 will not be otherwise further described.

Figure 2:
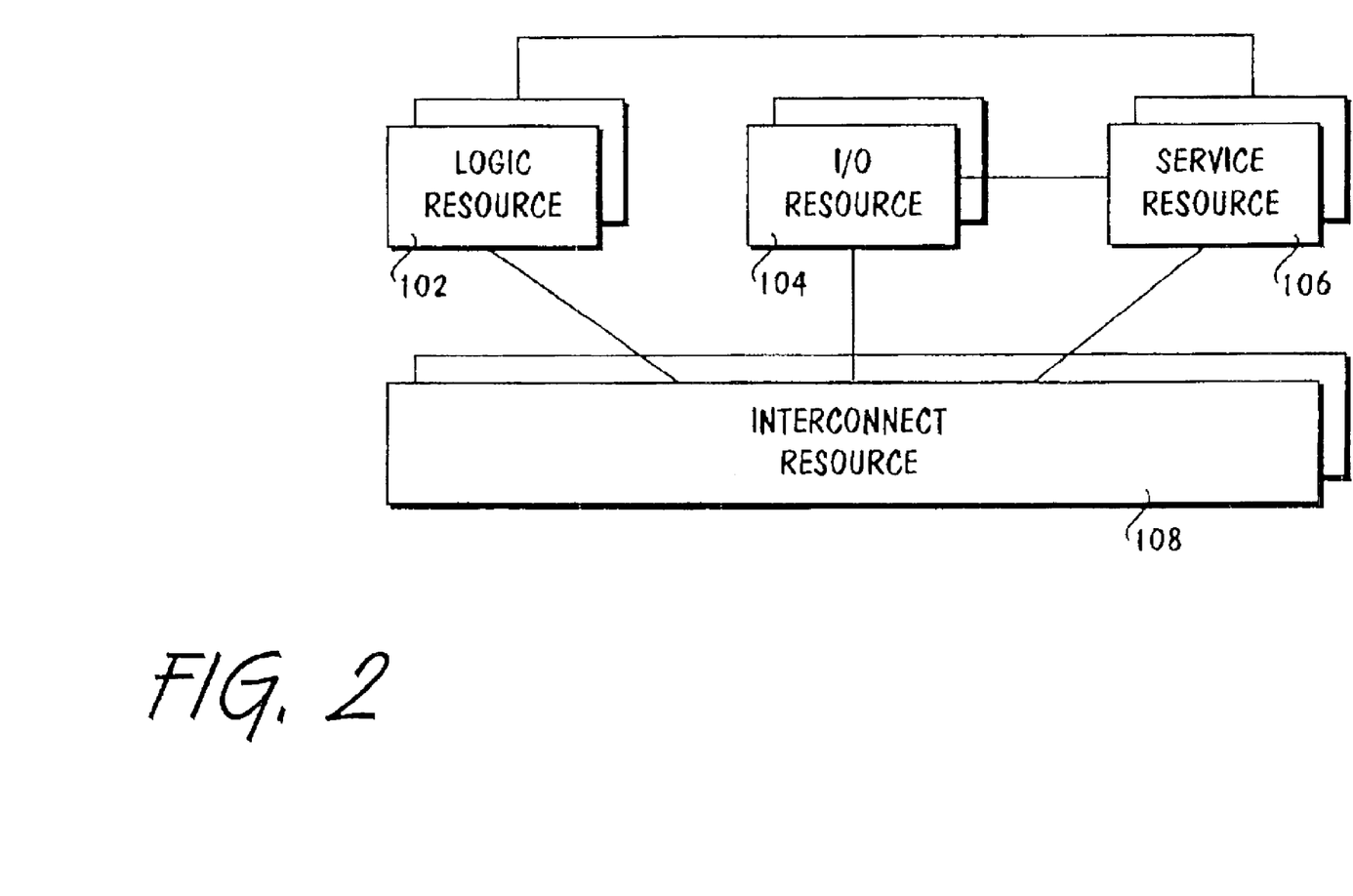
FIG. 2 is a block diagram showing the emulation resources in further details.

Similarly, except for the manner emulator 14 is used in a more efficient manner, as a result of novel circuit design mapping software 22, emulator 14 is intended to represent a broad category of emulators known in the art, as well as new emulators disclosed in various co-pending U.S. Patent Applications, contemporaneously filed, including U.S. patent application Ser. No. 09/404,923, titled "Clock Generation and Distribution In An Emulation System", and Ser. No. 09/405,602, titled "Emulation System Scaling", having at least one common inventor with the present invention. In other words, configuration unit 18 and host interface 20 perform their conventional functions, and they are conventionally constituted. As to the emulation resources or emulation array and interconnect 16, they too perform their conventional functions, and they are constituted with reconfigurable logic chips 102, I/O resources 104 and service resources 106, interconnected by reconfigurable interconnects 108 (see FIG. 2). These elements 102–108 may be coupled to each other in any one of a number of architectures, as well as packaged in any one of a number of form factors, e.g. with reconfigurable logic chips 102 distributively packaged in a number of logic boards, then in turn distributively packaged in a number of crates, and so forth. Reconfigurable logic chips 102 themselves may be general purpose field programmable gate arrays (FPGA) such as FPGAs available from Xilinx, or special purpose reconfigurable emulation logic chips with integrated emulation debugging facilities as disclosed in contemporaneously filed U.S. patent application Ser. No. 09/404,925, entitled "A Reconfigurable Integrated Circuit Having Integrated Debugging Facilities for use in an Emulation System". Similarly, reconfigurable interconnects 108 may be general purpose or special purpose interconnect chips. Furthermore, the various emulation resources available in emulation system 10 may be symmetrically or asymmetrically interconnected together (including partially symmetric interconnection, e.g. symmetric at the crate level, but asymmetric within a crate). Signals between the emulation resources may be routed in an un-multiplexed manner as in most prior art emulation systems, globally multiplexed as disclosed in an article by Jonathan Babb et al. entitled "Logic Emulation with Virtual Wires" or regionally multiplexed as disclosed in contemporaneously filed U.S. patent application Ser. No. 09/404,920, entitled "A Regionally Time Multiplexed Emulation System".

Referring back to FIG. 1, for the illustrated embodiment, circuit design mapping software 22 is pre-loaded and stored in a suitable storage medium such as a disk (not shown) of host system 12, and during operation, loaded into memory (not shown) of host system 12 for execution by a processor (not shown) of host system 12. In alternate embodiments, circuit design mapping software 22 may be distributed using any one of a number of distribution medium known in the art, such as CD, DVD or remote distribution through a server, and loaded onto host system 12 at the customer's site. Furthermore, in alternate embodiments, all or part of circuit design mapping software 22 may be implemented in hardware.

Figure 3:
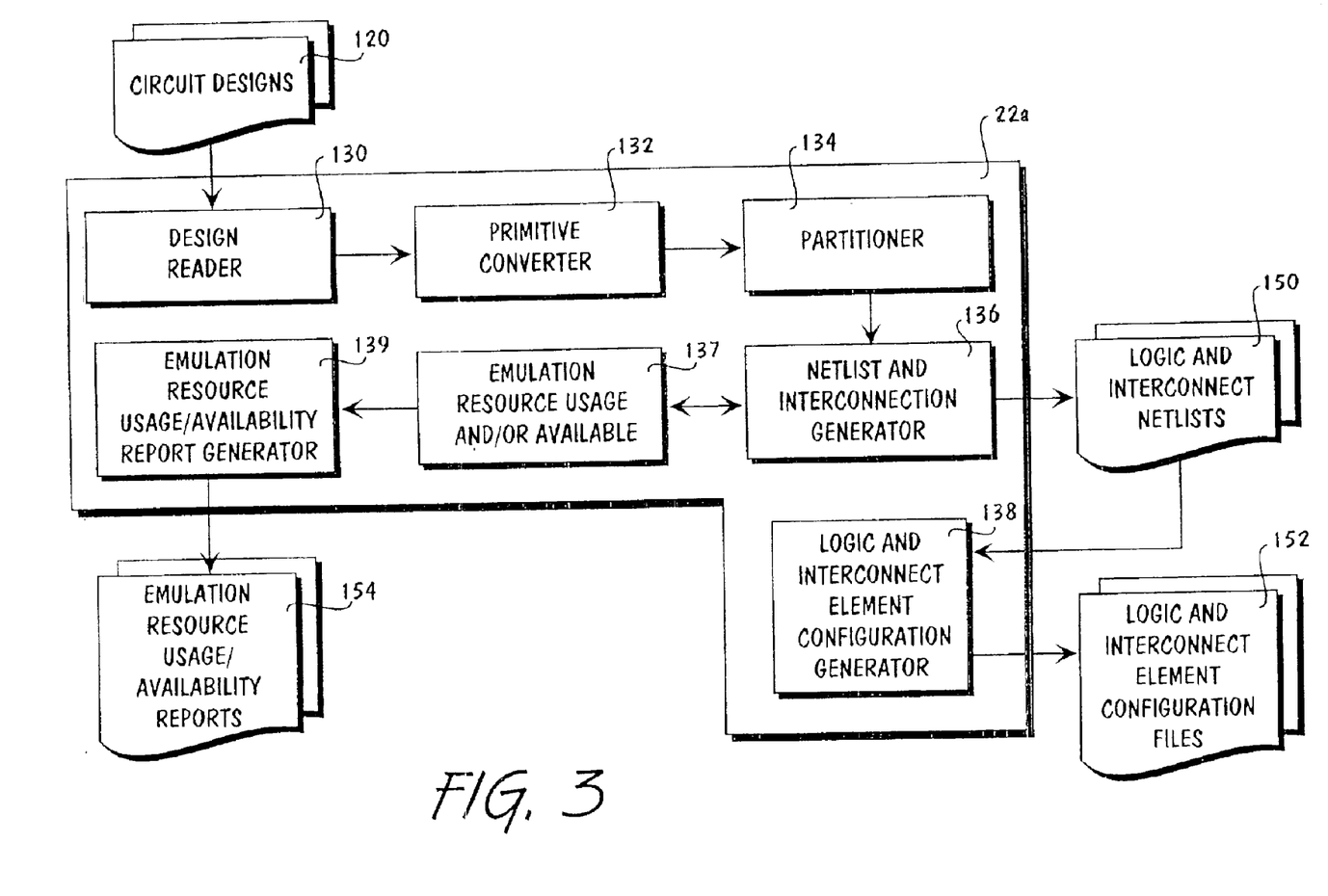
FIG. 3 is a block diagram showing one embodiment of the circuit design mapping software of FIG. 1.

Referring now to FIG. 3, wherein a block diagram illustrating on embodiment of circuit design mapping software 22 is shown. For the illustrated embodiment, circuit design mapping software 22a comprises design reader 130, primitive converter 132, partitioner 134, netlisting and interconnection generator 136, logic and interconnect element configuration generator 138, emulation resources usage/availability database 137 and emulation resources usage/availability report generator 139. Except for netlisting and interconnection generator 136, emulation resources usage/availability database 137 and emulation resources usage/availability report generator 139, design reader 130, primitive converter 132, partitioner 134 and logic and interconnect element configuration generator 138 are intended to represent a broad category of these elements known in the art. In the case of netlist and interconnection generator 136, except for the fact that it performs its function taking into consideration emulation resources required by other circuit designs to be emulated concurrently, netlisting and interconnection generator 136 is also intended to represent a broad category of such generators known in the art. In an alternate embodiment, netlist and interconnection generator 136 performs its function in view of residual emulation resources not allocated for emulation of other circuit designs to be emulated concurrently. For the illustrated embodiment, netlist and interconnection generator 136 keeps track of the emulation resources allocated for emulation of other circuit designs to be emulated concurrently, or residual emulation resources not allocated for emulation of other circuit designs to be emulated concurrently in emulation resource usage/availability database 137. Mapping software 22a is further equipped with emulation resource usage/availability reports 154 for users of emulation system 10.

In other words, design reader 130 is employed to process formally represented circuit designs 120, whereas primitive converter 132 is employed to convert various circuit primitives described in circuit designs 120, as in prior art emulation systems. Similarly, partitioner 134 in turn is employed to partition the transformed circuit designs for mapping to various emulation resources of emulator 14, and netlist and interconnector generator 136 is employed to generate logic and interconnection netlists 150 of the emulation resources of emulator 14 to "realize" the circuit designs. Except, in accordance with the present invention, for each set of circuit designs to be emulated together, netlist and interconnection generator 136 keeps track of either the emulation resources allocated for emulation of other circuit designs to be emulated concurrently, or residual emulation resources not allocated for emulation of other circuit designs to be emulated concurrently in emulation resource usage/availability database 137. For the illustrated embodiment, the segregation of circuit designs into the different sets of circuit designs to be emulated together is user controlled. However, for other embodiments, a circuit design's emulation set membership information may be provided to mapping software 22a, and netlist and interconnection generator 136 may be further equipped to track the emulation resource usage/availability information by emulation sets. Logic and interconnect element configuration generator 138 performs its conventional function of generating the configuration information for the reconfigurable emulation resources included in logic and interconnect netlists 150 of the circuit designs.

Figure 4:
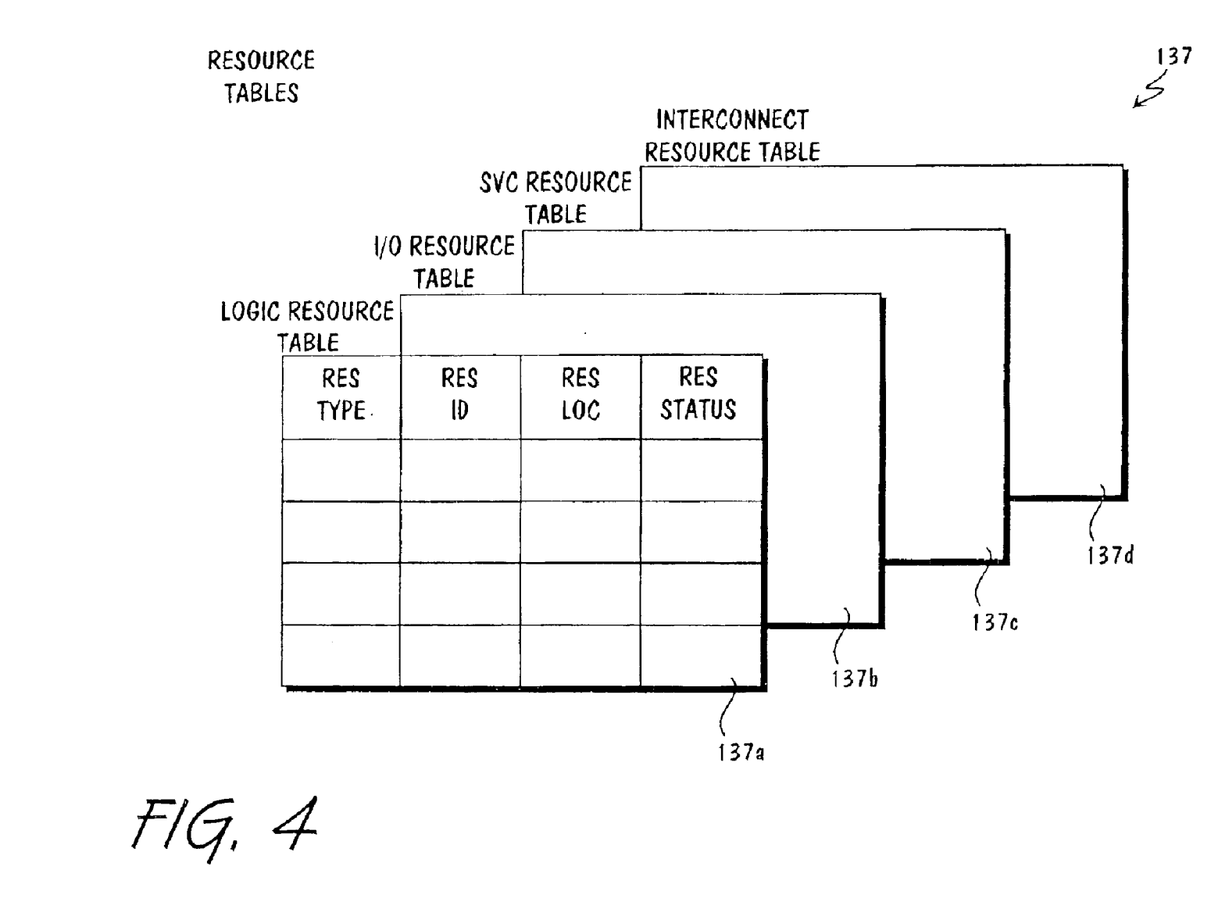
FIG. 4 is a block diagram showing one embodiment of a collection of tables for tracking usage status of the emulation resources.

Skipping now to FIG. 4, wherein one embodiment of emulation resource usage/availability database 137 is shown. For the illustrated embodiment, emulation resource usage/availability database 137 comprises a number of tables 137a–137d. Each table 137a, . . . or 137d is employed to track usage/availability information of one emulation resource type, e.g., logic chips, I/O resources, and so forth. For each emulation resource type, the corresponding table includes a resource record for each resource element of the resource type, including information such as resource identification (Res ID), resource location (Res Loc), resource status (Res Status), i.e. used or available, and so forth. In alternate embodiments, other data structures may be employed.

Returning now to FIG. 3, emulation resource usage/availability report generator 139 generates emulation resource usage/availability reports 154 for users of emulation 10, allowing the users to determine whether the various emulation sets utilize emulation resources of emulator 14 efficiently or not, and reorganizing the various concurrent emulation set if necessary. Report generator 139 may be implemented in any one of a number of known approaches, and reports 154 may be generated in any one of a number of formats, preferably a user friendly format.

Figure 5:
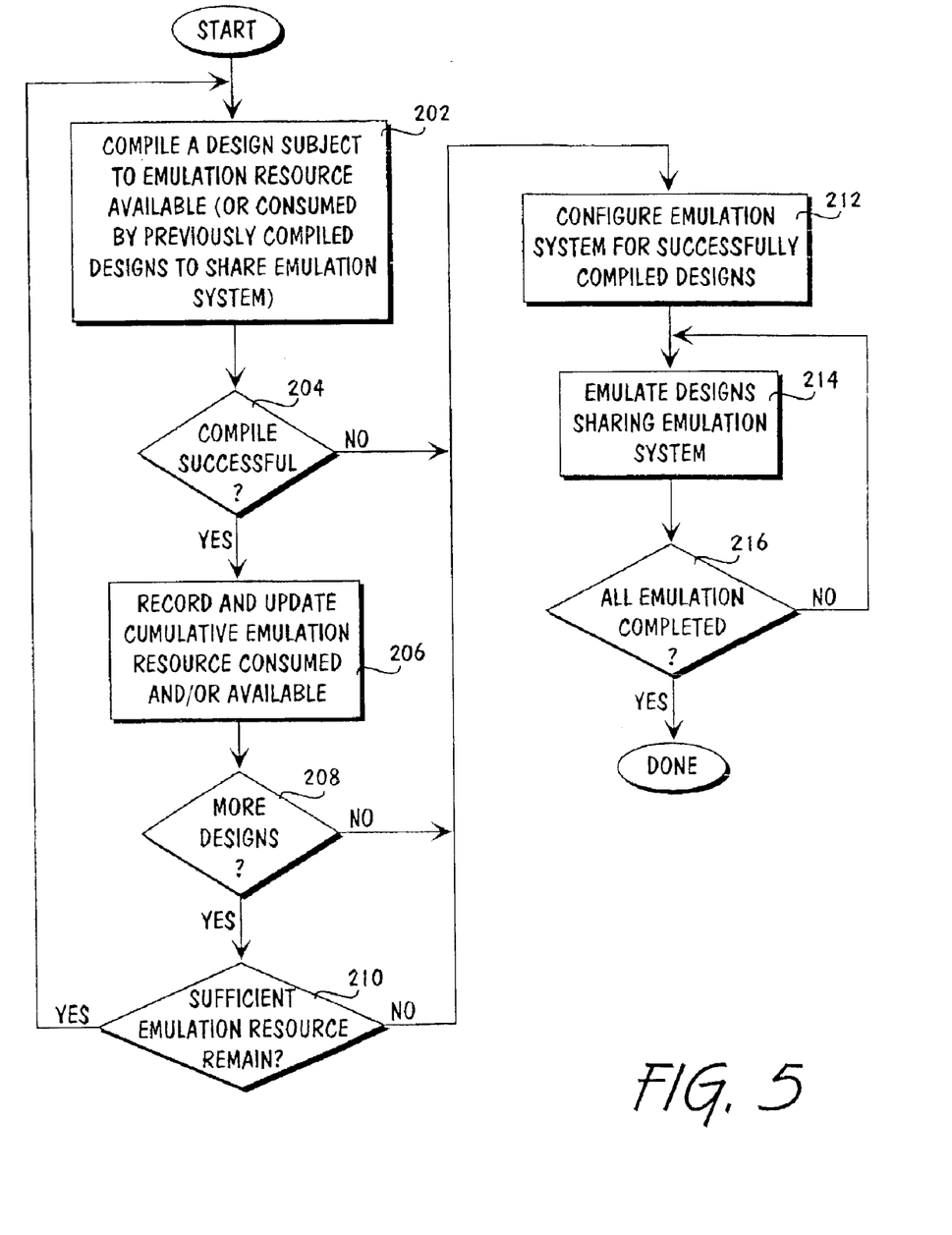
FIG. 5 is a flow diagram showing one embodiment of the method steps of the present invention.

Skipping now to FIG. 5, wherein a flow diagram illustrating one embodiment of the method steps of the present invention (for use with the embodiment of mapping software 22a of FIG. 3) is shown. As illustrated, at step 202, a circuit design is compiled subject to either emulation resources allocated for emulation of other circuit designs to be emulated concurrently or residual emulation resources not allocated for emulation of other circuit designs to be emulated concurrently. If the compilation is successful, step 204, the emulation resources usage/availability information maintained in the emulation resources usage/availability database 137 is updated to reflect the incremental allocation of emulation resources, step 206.

Steps 202–206 are repeated if there are additional circuit designs to be compiled, that is circuit designs that are to be emulated concurrently, step 208. For the illustrated embodiment, repetition of steps 202–206 is further subject to the amount of residual emulation resources left, step 210. Any one of a number of metrics, e.g. number of unused logic chips and so forth, may be employed to measure whether there are sufficient residual emulation resources left to make another compile attempt worthwhile, and the threshold values for the metrics may be established empirically, depending on the complexities of the circuit designs.

In any event, when the coordinated compilations of the various circuit designs to be emulated concurrently have been "completed" (in other words, actual completion of all desired compilations or compilations terminated as a result of having effectively exhausted all emulation resources), the emulation resources of emulator 14 are configured in a coordinated manner using the configuration information generated in accordance with the above described coordinated manner, step 212. Once configured in a coordinated manner, the various circuit designs may be emulated concurrently, step 214. (Note that the fact the circuit designs may be emulated concurrently, does not mean that the circuit designs have to be emulated concurrently.) Step 214 is continued until emulation of the circuit designs have been "completed", step 216. For the purpose of this application, "completion" may also occur when a different set of circuit designs is to be emulated concurrently. The "new" set may include circuit designs that were included in the "old" set. Accordingly, emulation system 10 equipped with mapping software 22a of FIG. 3 provides improved utilization efficiency over prior art emulation systems.

Figure 6:
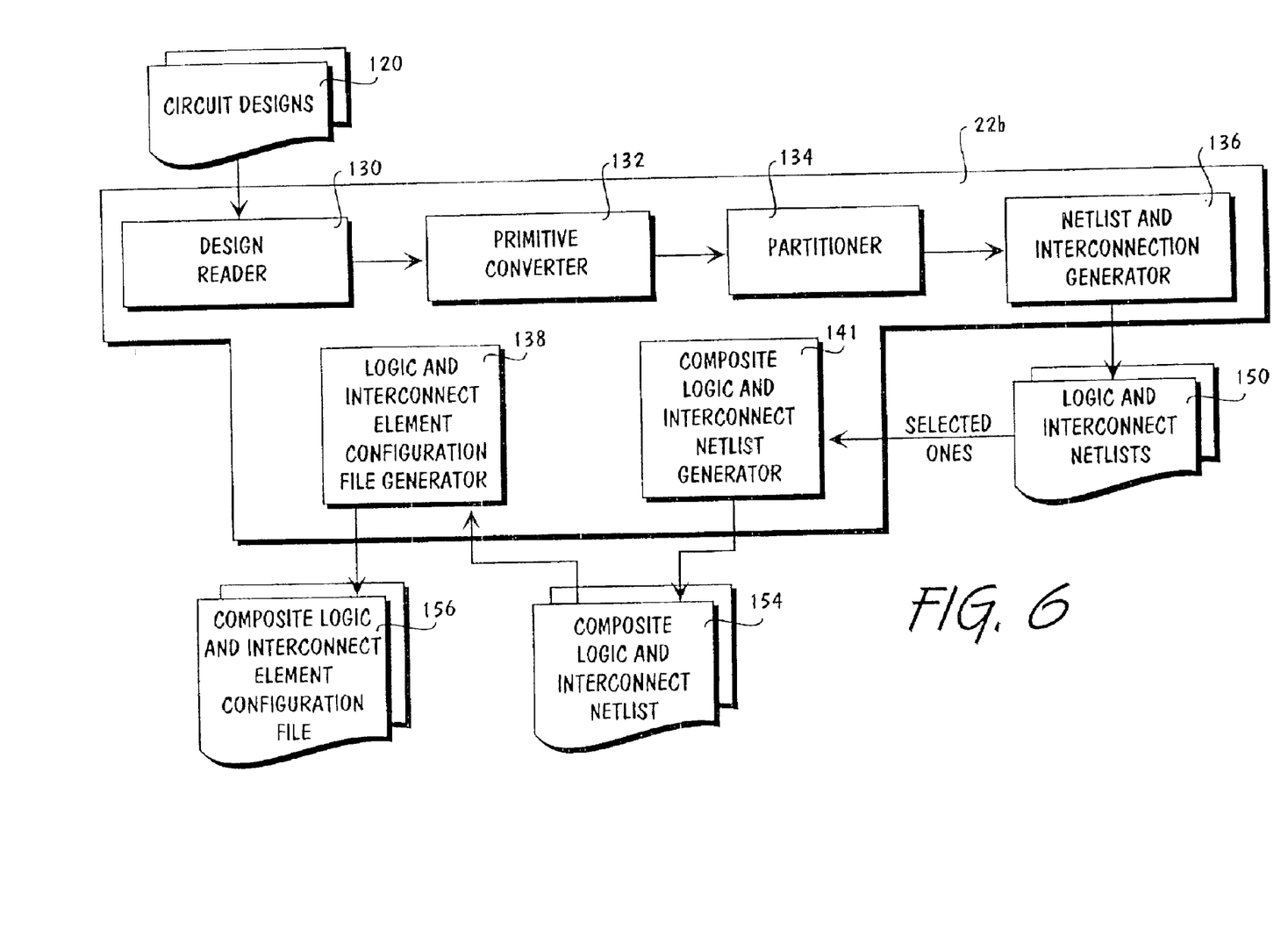
FIG. 6 is a block diagram showing an alternate embodiment of the circuit design mapping software of FIG. 1.

Referring now to FIG. 6, wherein a block diagram illustrating another embodiment of circuit design mapping software 22 is shown. For the illustrated embodiment, circuit design mapping software 22b is similarly constituted as circuit design mapping software 22a, except, in lieu of emulation resource usage/availability database 137 and emulation resource usage/availability report generator 139, circuit design mapping software 22b is provided with composite netlist and interconnection generator 141 instead; and netlist and interconnection generator 136 performs its function in the conventional manner (i.e. without taking into consideration emulation resources used by other concurrently emulated circuit designs). More specifically, composite netlist and interconnection generator 141 is employed to coordinate and generate a composite logic and interconnection netlist 154 for a number of independently generated logic and interconnection netlists 150.

In other words, as described earlier, design reader 130 is employed to process formally represented circuit designs 120, whereas primitive converter 132 is employed to convert various circuit primitives described in circuit designs 120, as in prior art emulation systems; and partitioner 134 in turn is employed to partition the transformed circuit designs for mapping to various emulation resources of emulator 14. However, netlist and interconnector generator 136 is employed to independently generate logic and interconnection netlists 150 of the emulation resources of emulator 14 to "realize" the circuit designs, without coordination between the circuit designs to be emulated concurrently.

Once logic and interconnect netlists 150 for the various circuit designs are generated independently, the logic and interconnect netlists 150 of those circuit designs to be emulated concurrently are provided to composite logic and interconnect netlist generator 141, which in response, generates a composite logic and interconnect netlist 154 for the circuit designs that can be emulated concurrently. The composite logic and interconnect netlist 154 is then provided to the conventional logic and interconnect element configuration generator 138 to generate the coordinated configuration information 156 for configuring the emulation resources of emulator 14 in a coordinated manner to emulate the circuit designs concurrently.

Figure 7:
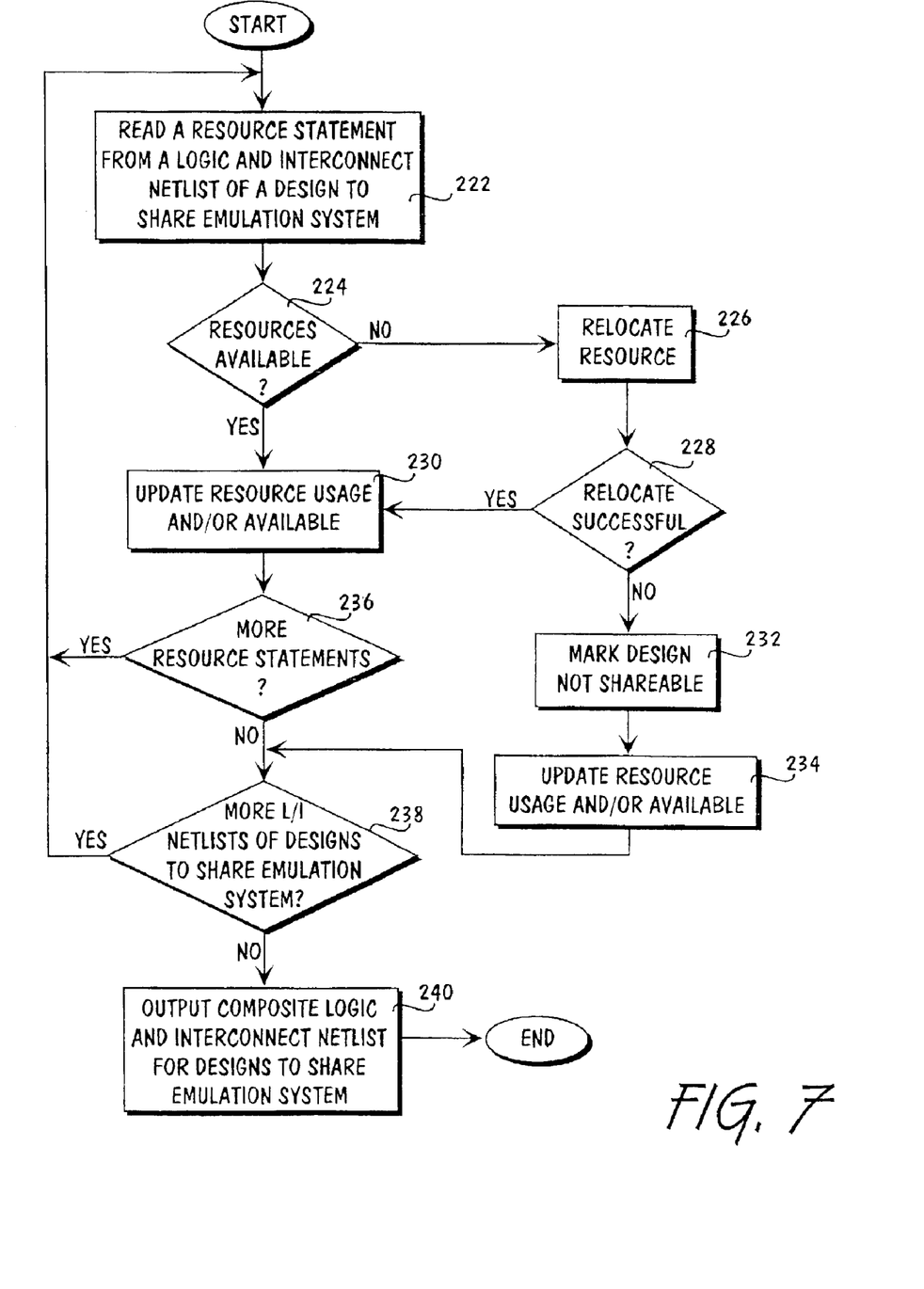
FIG. 7 is a flow diagram showing one embodiment of the operational flow of the composite logic and interconnect netlist generator of FIG. 6.

Referring now to FIG. 7, wherein one embodiment of the operational flow of composite logic and interconnect netlist generator 141 is shown. As shown, at step 222, a resource statement is read from a logic and interconnect netlist of a circuit design to be emulated concurrently with other circuit designs. At step 224, the determination is made whether the specified resource is available. If the specified resource is available, composite logic and interconnect netlist generator 141 keeps track of the usage or residual availability of the resources, and proceeds to determine if there are more resource statements to be processed, step 236. Note that if the emulation resources of emulator 14 are symmetrically organized, the relocation process is a simple "virtual to physical" type mapping process. On the other hand, if the emulation resources of emulator 14 are asymmetrically organized, any one of a number of incremental search techniques may be employed. Tracking of resource usage or residual resource availability may be accomplished in a similar manner as earlier described. Steps 222–230 are repeated until either all resource statements of a logic and interconnect netlist have been processed or until a failure is encountered at step 228, when attempting to relocate an unavailable required resource.

In the former case, composite logic and interconnect netlist generator 141 proceeds from step 236 to step 238 directly. In the latter case, composite logic and interconnect netlist generator 141 performs steps 232 and 234 before proceeding to step 238. At step 232, composite logic and interconnect netlist generator 141 marks the circuit design as being ineligible for concurrent emulation with the other circuit designs. Then, at step 234, composite logic and interconnect netlist generator 141 updates the resource usage/availability information it maintains, i.e. deallocating all resources previously allocated to the ineligible circuit design.

In any event, at step 238, composite logic and interconnect netlist generator 141 determines if additional logic and interconnect netlists are to be processed. Note that the failure to accommodate a circuit design does not mean that no more circuit designs can be included in the set of circuit designs to be emulated concurrently, as the additional circuit designs to be considered may have less conflicting resource requirements. If there are additional logic and interconnect netlists to be processed, composite logic and interconnect netlist generator 141 continues operation at step 222 as described earlier, otherwise it outputs the composite logic and interconnect netlist for the circuit designs eligible to be emulated concurrently, step 240.

Figure 8:
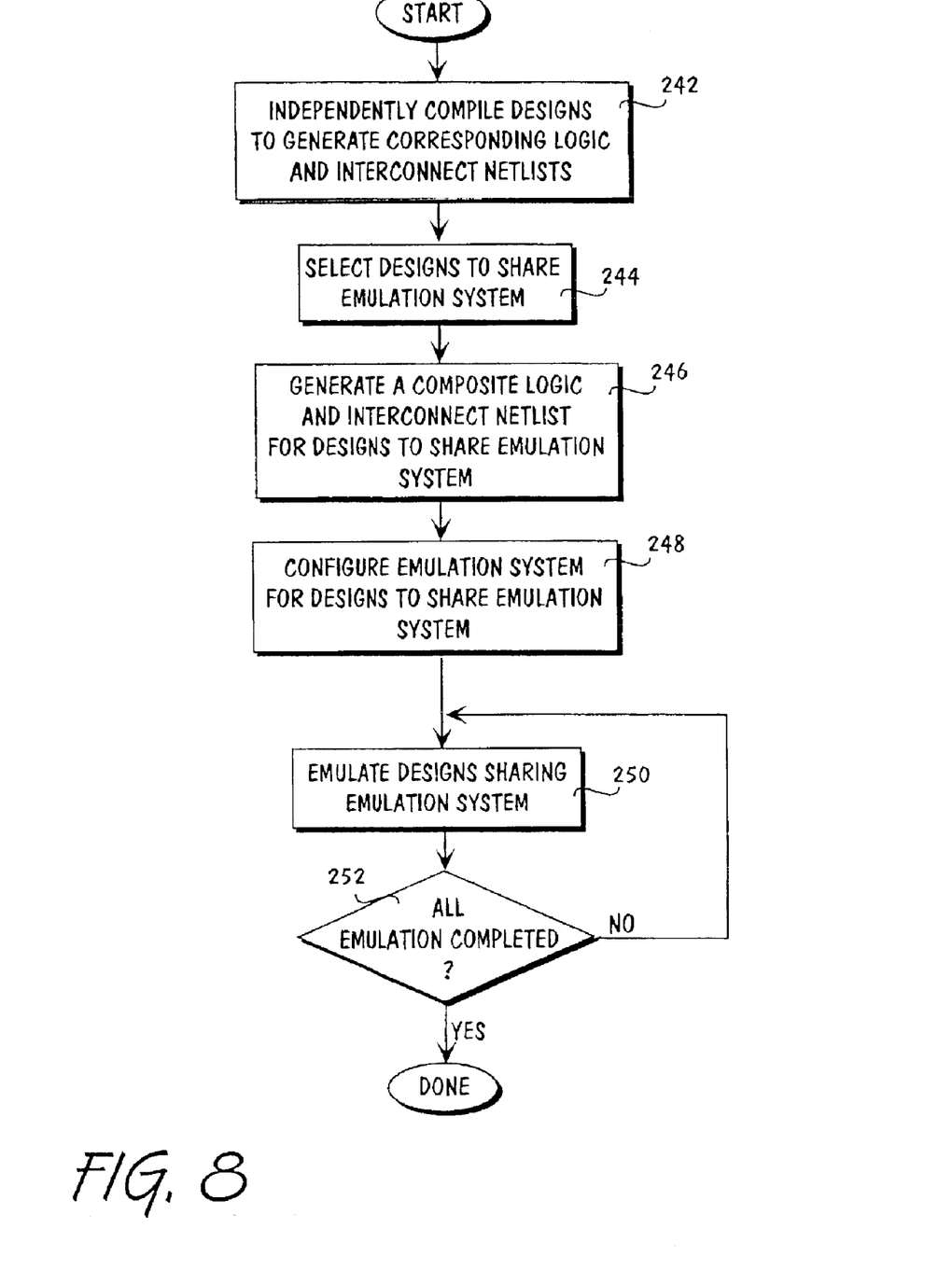
FIG. 8 is a flow diagram showing an alternate embodiment of the method steps of the present invention.

Referring now to FIG. 8, wherein a flow diagram illustrating one embodiment of the method steps of the present invention (for use with the embodiment of mapping software 22b of FIG. 6) is shown. As illustrated, at step 242, circuit designs are compiled independently to generate corresponding logic and interconnect netlists of the emulation resource of emulator 14 without coordination. At step 244, a user's selection of the circuit designs to be emulated concurrently is provided to composite logic and interconnect netlist generator 141. In response, at step 246, composite logic and interconnect netlist generator 141 generates the composite logic and interconnect netlist for eligible ones of the selected circuit designs as described earlier.

Once generated, the emulation resources of emulator 14 are configured in a coordinate manner using the configuration information generated in accordance with the above described coordinate manner, step 248. Once configured in a coordinate manner, the various circuit designs may be emulated concurrently, step 250. (Again, note that circuit designs eligible to be emulated concurrently does not mean that the circuit designs have to be emulated concurrently.) Step 250 is continued until emulation of all circuit designs have been completed, step 252. (Again, "completion" is encountered if the users desire to reconfigure the emulation system to emulate an alternate set of circuit designs.) Accordingly, emulation system 10 equipped with mapping software 22b of FIG. 6 also provides improved utilization efficiency over prior art emulation systems.

Figure 9:
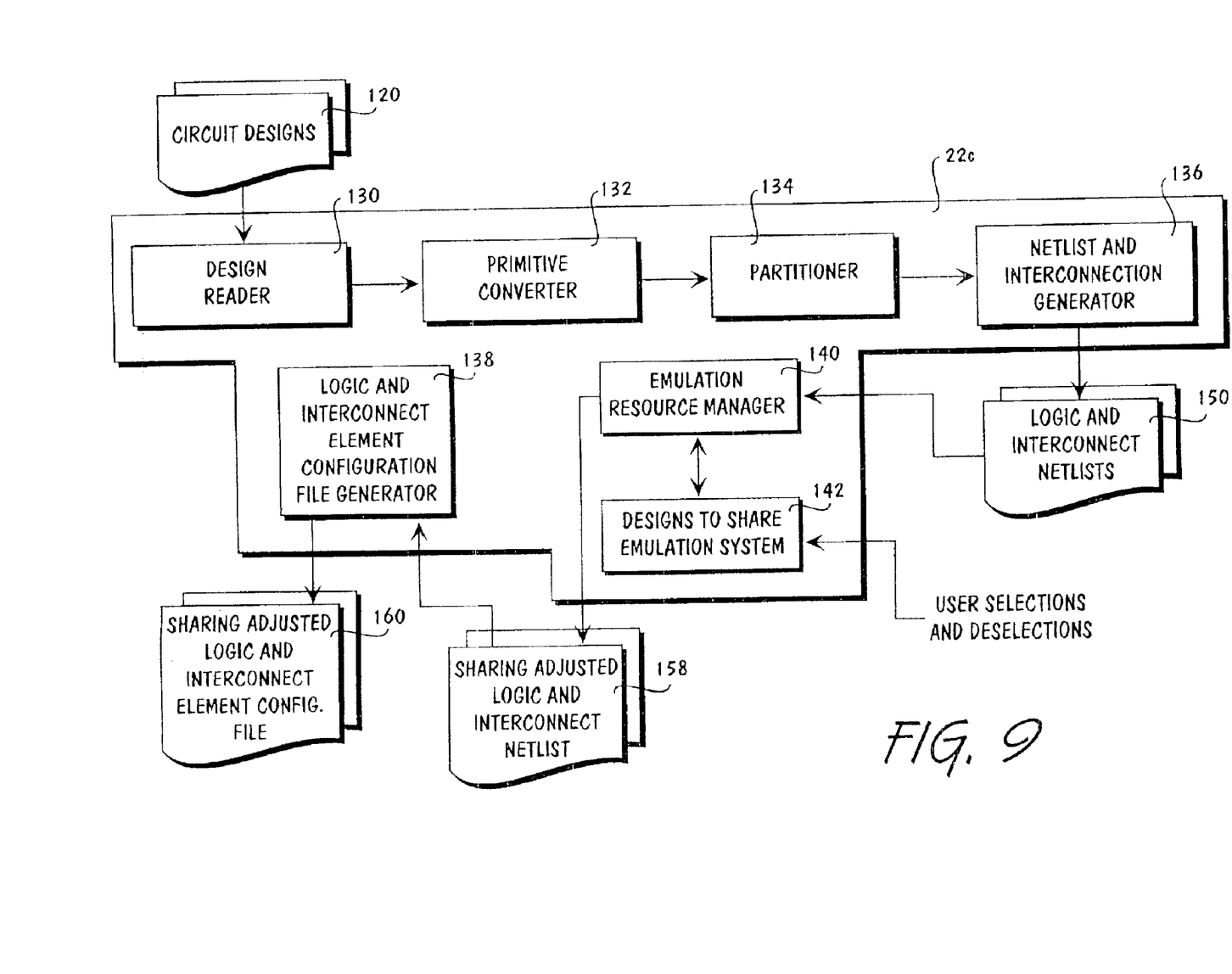
FIG. 9 is a block diagram showing yet another alternate embodiment of the circuit design mapping software of FIG. 1.

Referring now to FIG. 9, wherein a block diagram illustrating another embodiment of circuit design mapping software 22 is shown. For the illustrated embodiment, circuit design mapping software 22c is similarly constituted as circuit design mapping software 22b, except, in lieu of composite logic and interconnect netlist generator 141, circuit design mapping software 22c is provided with emulation resource manager 140 and designs to be emulated concurrently queue (also referred to as the "share queue") 142 instead. More specifically, emulation resource manager 140 is employed to dynamically manage incremental configuration of the emulation resources of emulator 14, whereas designs to be emulated concurrently queue 142 is employed to provide emulation resource manager 140 with the user selections and deselections of circuit designs to be emulated concurrently. Note that in other embodiments, other suitable data structures may be used to convey the users' selections and deselections of circuit designs for concurrent emulation, in lieu of queue 142.

In other words, as described earlier for the second embodiment, design reader 130 is employed to process formally represented circuit designs 120, whereas primitive converter 132 is employed to convert various circuit primitives described in circuit designs 120, as in prior art emulation systems. Similarly, partitioner 134 in turn is employed to partition the transformed circuit designs for mapping to various emulation resources of emulator 14, and netlist and interconnection generator 136 is employed to independently generate logic and interconnection netlists 150 of the emulation resources of emulator 14 to "realize" the circuit designs, without coordination between the circuit designs to be emulated concurrently. Except, unlike the second embodiment, the independent logic and interconnect netlists 150 of the circuit designs to be emulated concurrently need not be all generated before emulation begins. In other words, the logic and interconnect netlists 150 of the circuit designs may be generated independently in time as well.

Once the logic and interconnect netlist 150 for a circuit design has been generated, a user may select the circuit design for concurrent emulation, and notify emulation resource manager 140 through designs to be emulated concurrently queue 142. In response, emulation resource manager 140 processes the logic and interconnect netlist 150 of the circuit design to generate a "sharing adjusted" logic and interconnect netlist 158, adjusting or relocating the required emulation resource as necessary. Additionally, emulation resource manager 140 updates and keeps track of the cumulative emulation resources allocated. The resource adjustment or relocation process is similar to the location process employed by composite logic and interconnect netlist generator 141 described earlier, and the tracking of resource usage or residual resource availability can be accomplished in a similar manner as earlier described.

The "sharing adjusted" logic and interconnect netlist 158 of the circuit design is then provided to logic and interconnect element configuration generator 148. In response, logic and interconnect element configuration generator 138 generates "sharing adjusted" configuration information 160 for configuring the emulation resources of emulator 14 in an adjusted manner, accommodating circuit designs for which emulator 14 has already been configured for, to emulate the circuit designs concurrently. In one embodiment, emulation of previously configured circuit designs are halted, when configuration of a new "sharing" circuit design is performed. In other embodiments, where emulation resources of emulator 14 allows dynamic configuration, configuration of the new "sharing" circuit design is performed, without halting emulation of previously configured circuit designs.

Figure 10:
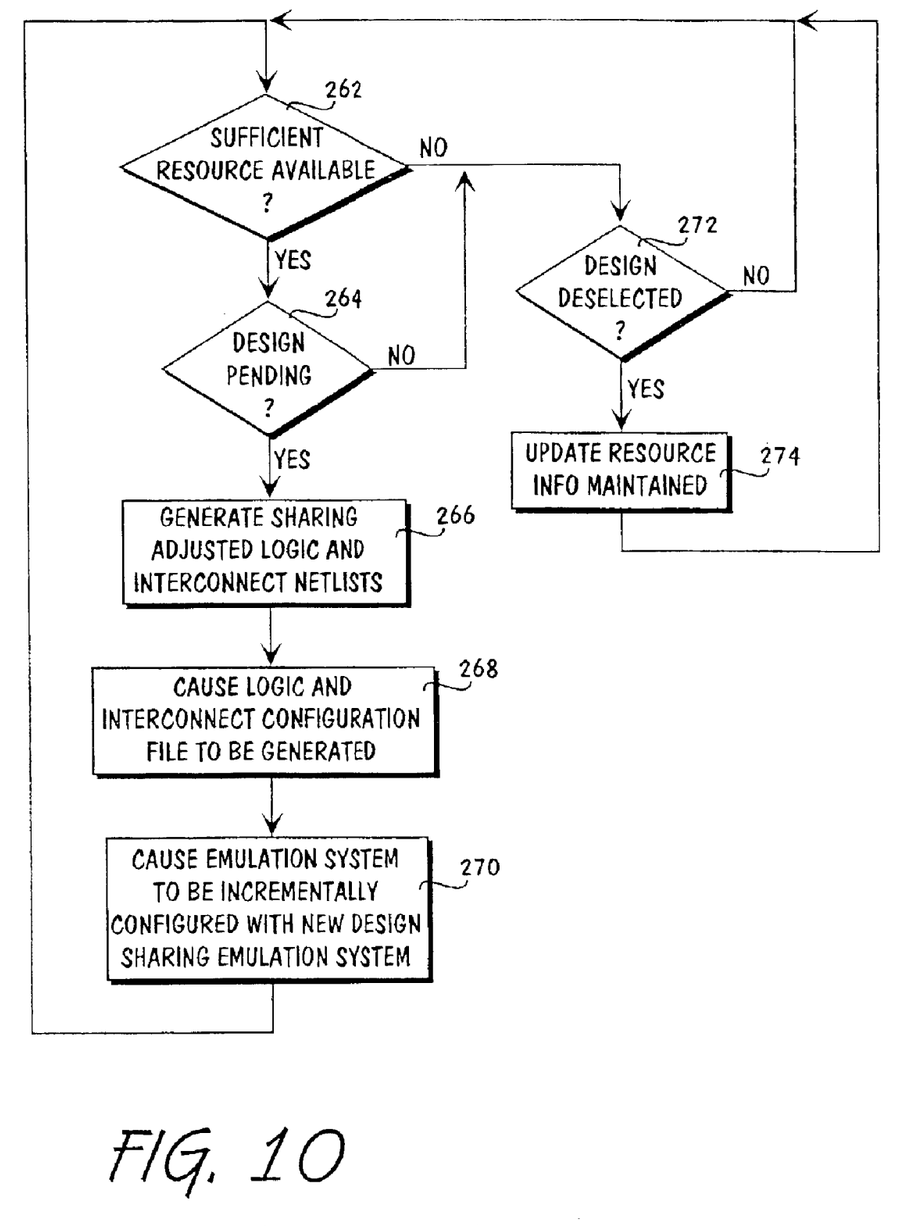
FIG. 10 is a flow diagram showing one embodiment of the emulation resource manager of FIG. 9.

Referring now to FIG. 10, wherein one embodiment of the operational flow of emulation resource manager 140 is shown. As shown, at step 262, emulation resource manager 140 determines if there are sufficient resources available to consider whether the emulation resources can be incrementally configured to emulate another circuit design, in addition to the circuit designs configured, if any. As described earlier, any one of a number of metrics and thresholds may be employed to make the determination. If there are insufficient resources to consider another circuit design, emulation resource manager 140 proceeds to step 272 to determine if the user has finished emulation of a configured circuit design and denoted its deselection among the circuit designs to be emulated concurrently. If a deselection is detected, emulation resource manager 140 updates the resource usage/availability information it maintains, deallocating the emulation resources allocated to the deselected circuit design, step 274. In either case, i.e. no deselection detected, or completion of deallocation, emulation resource manager 140 returns to step 262.

On the other hand, if it is determined at step 262 that resources are available to consider another circuit design, emulation resource manager 140 proceeds to step 264 to determine if there are any user selected circuit designs pending configuration. If there are no circuit designs pending configuration, emulation resource manager 140 returns to step 262, otherwise emulation resource manager 140 proceeds to step 266.

At step 266, emulation resource manager 140 generates the "sharing adjusted" logic and interconnect netlist for the selected circuit design as described earlier. Next, emulation resource manager 140 causes the "sharing adjusted" logic and interconnect configuration information to be generated as described earlier, step 268. Then, emulation resource manager 140 causes the emulation resources of emulator 14 to be incrementally configured for the selected circuit design, thereby coordinating its resource usage with previously configured circuit designs, allowing the circuit designs to be emulated concurrently. Upon incrementally configuring the emulation resources for the selected circuit design, emulation resource manager 140 returns to step 262 again.

Figure 11:
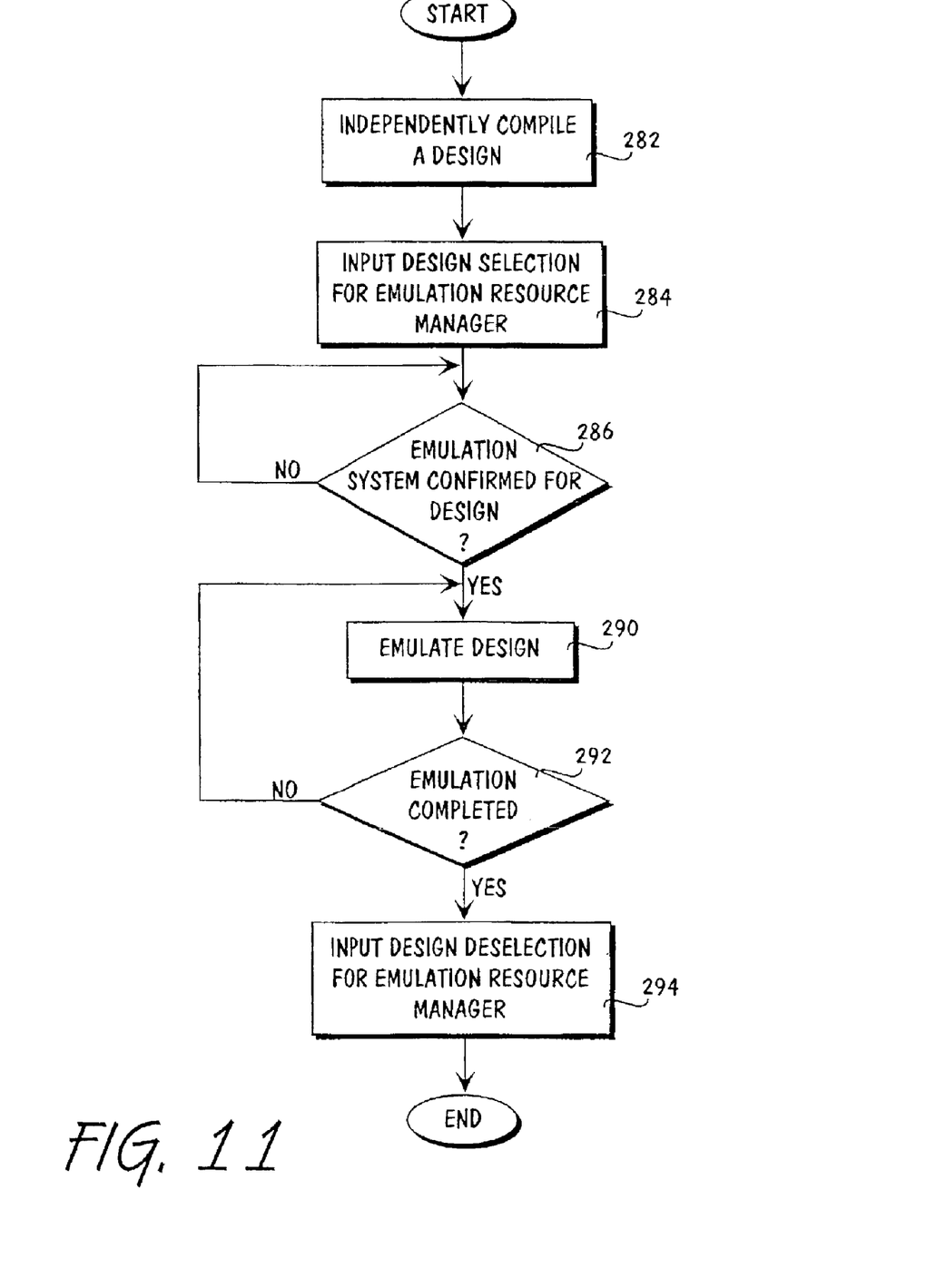
FIG. 11 is a flow diagram showing an alternate embodiment of the method steps of the present invention.

Referring now to FIG. 11, wherein a flow diagram illustrating one embodiment of the method steps of the present invention (for use with the embodiment of mapping software 22c of FIG. 9) is shown. As illustrated, at step 282, a circuit design is compiled independently to generate a corresponding logic and interconnect netlist of the emulation resources of emulator 14 without coordination with other circuit designs to be emulated concurrently. At step 284, a user provides an indication of the selection of the circuit design to be emulated concurrently with other configured circuit designs to emulation resource manager 140. In response, at step 286, emulation resource manager 140 attempts to incrementally configure emulation resources of emulator 14 as described earlier.

If the incremental configuration is successful, the circuit design may be emulated concurrently with other previously configured circuit designs, step 290. Step 290 is continued until emulation of the circuit design is completed, step 292. At such time, the user provides an indication of the deselection of the circuit design for concurrent emulation to emulation resource manager 140. Accordingly, emulation system 10 equipped with mapping software 22c of FIG. 6 also provides improved utilization efficiency over prior art emulation systems.

While for ease of understanding, the present invention has been described in terms of the above illustrated embodiments, those skilled in the art will recognize that the invention is not limited to the embodiments described. The present invention can be practiced with modification and alteration within the spirit and scope of the appended claims. The description is thus to be regarded as illustrative instead of restrictive on the present invention.

Thus, a method and apparatus for concurrent emulation of multiple circuit designs in an emulation system has been described.

What is claimed is:

1. An emulation system, comprising:

(a) an emulator having reconfigurable emulation resources reconfigurable to emulate circuit designs; and (b) a computer configured to generate configuration information for a first and a second circuit design to enable the reconfigurable emulation resources to be configured to emulate the first and the second circuit designs concurrently, wherein the computer is further configured to generate the configuration information for the first and second circuit design from netlists of the first and the second circuit design, the netlist of the second circuit design being generated taking into consideration those of the reconfigurable emulation resources allocated to the first circuit design.

2. The emulation system of claim 1, wherein the computer is further configured to keep track of those of the reconfigurable emulation resources that are allocated to the emulation of the first circuit design.

3. The emulation system of claim 1, wherein the reconfigurable emulation resources are a plurality of field programmable gate arrays.

4. An emulation system, comprising:

(a) an emulator having reconfigurable emulation resources reconfigurable to emulate circuit designs; and (b) a computer configured to generate configuration information for a first and a second circuit design to enable the reconfigurable emulation resources to be configured to emulate the first and the second circuit designs concurrently, wherein the computer is further configured to generate the configuration information for the first and second circuit designs from logic and interconnect netlists of the first and the second circuit designs, the logic and interconnect netlist of the second circuit design being generated taking into consideration those of the reconfigurable emulation resources not allocated to the first circuit design.

5. The emulation system of claim 4, wherein the computer is further configured to keep track of those of the reconfigurable emulation resources that are not allocated to the emulation of the first circuit design.

6. The emulation system of claim 4, wherein the reconfigurable emulation resources are a plurality of field programmable gate arrays.

7. A method for concurrently emulating first and second circuit designs, comprising:

generating a first netlist for the first circuit design;

allocating a subset of reconfigurable emulation resources to the first circuit design;

generating a second netlist for the second circuit design, the second netlist being based on the subset of reconfigurable emulation resources allocated to the first circuit design;

generating configuration information for the first and second circuit designs based on the first and second netlists; and configuring reconfigurable resources, based on the configuration information, to emulate the first and second circuit designs.

8. A method for concurrently emulating first and second circuit designs, comprising:

generating a first netlist for the first circuit design;

allocating a subset of reconfigurable emulation resources to the first circuit design;

generating a second netlist for the second circuit design, the second netlist being based on those of reconfigurable emulation resources that are not allocated to the first circuit design;

generating configuration information for the first and second circuit designs based on the first and second netlists; and configuring reconfigurable resources, based on the configuration information, to emulate the first and second circuit designs.

* * * * *